(12) United States Patent
Trinh

(10) Patent No.: US 9,936,589 B2
(45) Date of Patent: Apr. 3, 2018

(54) ELECTRICAL DEVICES AND METHODS FOR MANUFACTURING SAME

(71) Applicant: Presidio Components. Inc., San Diego, CA (US)

(72) Inventor: Hung Van Trinh, La Jolla, CA (US)

(73) Assignee: Presidio Components, Inc., San Diego, CA (US)

( * ) Notice: Subject to any disclaimer, the term of this patent is extended or adjusted under 35 U.S.C. 154(b) by 0 days.

(21) Appl. No.: 15/055,859

(22) Filed: Feb. 29, 2016

(65) Prior Publication Data

US 2016/0183384 A1 Jun. 23, 2016

Related U.S. Application Data

(62) Division of application No. 14/251,988, filed on Apr. 14, 2014.

(51) Int. Cl.
*B23K 31/02* (2006.01)
*H05K 3/34* (2006.01)
(Continued)

(52) U.S. Cl.
CPC ......... *H05K 3/3426* (2013.01); *B23K 1/0016* (2013.01); *B23K 35/262* (2013.01);
(Continued)

(58) Field of Classification Search
CPC ......... H05K 3/3426; H05K 2203/1377; H05K 2201/10787; H05K 2203/047;
(Continued)

(56) References Cited

U.S. PATENT DOCUMENTS 4,675,790 A * 6/1987 DeMatos ............... H01G 9/012
361/540
4,748,537 A * 5/1988 Hernandez ............. H01G 2/06
174/72 B
(Continued)

FOREIGN PATENT DOCUMENTS

| EP | 0090964 A2 | 10/1983 |
| EP | 0246447 A2 | 11/1987 |
| EP | 0632682 A1 | 1/1995 |

OTHER PUBLICATIONS

U.S. Patent and Trademark Office, Final Office Action in U.S. Appl. No. 14/251,988, dated Nov. 10, 2016.
(Continued)

*Primary Examiner* — Kiley Stoner
(74) *Attorney, Agent, or Firm* — Wood Herron & Evans LLP

(57) ABSTRACT

An electrical device for soldering to a circuit board with a solder includes a capacitor, a lead frame including a solder dam, and a solder joint electrically coupling the capacitor to the lead frame. The solder dam includes one of a physical barrier to flow or an area of reduced wettability to the solder. The solder dam is between the solder joint and the circuit board. The solder dam is on one or both of a lead portion and main portion of the lead frame. In one embodiment, the first solder dam extends substantially the full width of the first lead portion. The solder dam may be a barrier and/or include a metal oxide. A method of manufacturing the device includes soldering a lead frame to a capacitor with a solder and modifying a surface on the lead frame to include a physical barrier and/or an area of reduced wettability.

21 Claims, 8 Drawing Sheets

(51) Int. Cl.
*H01G 2/06* (2006.01)
*B23K 1/00* (2006.01)
*B23K 35/26* (2006.01)
*C22C 13/00* (2006.01)

(52) U.S. Cl.
CPC .............. *C22C 13/00* (2013.01); *H01G 2/06* (2013.01); *H05K 2201/10015* (2013.01); *H05K 2201/10628* (2013.01); *H05K 2201/10787* (2013.01); *H05K 2203/047* (2013.01); *H05K 2203/1173* (2013.01); *H05K 2203/1377* (2013.01); *Y02P 70/613* (2015.11)

(58) Field of Classification Search
CPC .......... H05K 2201/10628; H05K 2201/10015; H05K 2203/117; C22C 13/00; B23K 1/0016; B23K 35/262; B23K 2201/36–2201/42; H01G 2/06; Y02P 70/613
USPC .................. 228/179.1–180.22, 215
See application file for complete search history.

(56) References Cited

U.S. PATENT DOCUMENTS

| | | | | |
|---|---|---|---|---|
| 4,892,245 A * | 1/1990 | Dunaway | ............... | B23K 1/008 228/180.22 |
| 4,898,320 A * | 2/1990 | Dunaway | ................ | B23K 1/20 228/245 |
| 4,948,032 A * | 8/1990 | Dunaway | ........... | B23K 35/3612 148/23 |
| 5,066,614 A * | 11/1991 | Dunaway | ............. | B23K 35/268 228/123.1 |
| 5,161,729 A * | 11/1992 | Dunaway | ............. | B23K 35/268 228/180.22 |
| 5,293,006 A | 3/1994 | Yung | | |
| 5,929,511 A * | 7/1999 | Nakazawa | ............ | H01L 21/565 257/666 |
| 5,964,395 A * | 10/1999 | Glovatsky | .......... | B23K 35/0222 228/123.1 |
| 6,081,416 A * | 6/2000 | Trinh | ....................... | H01G 4/12 361/308.1 |
| 6,300,678 B1 | 10/2001 | Suehiro et al. | | |
| 6,378,758 B1 * | 4/2002 | Haba | ................ | H01L 23/49811 228/180.1 |
| 6,473,291 B1 * | 10/2002 | Stevenson | ............. | H01G 4/228 361/301.4 |
| 6,816,356 B2 | 11/2004 | Devoe et al. | | |
| 6,903,920 B1 * | 6/2005 | Prymak | .................. | H01G 2/065 361/306.1 |
| 6,917,510 B1 * | 7/2005 | Prymak | .................. | H01G 2/065 361/309 |
| 7,633,739 B2 | 12/2009 | Devoe | | |
| 8,289,675 B2 | 10/2012 | Devoe et al. | | |
| 8,902,565 B2 * | 12/2014 | McConnell | ................ | 361/306.3 |
| 9,106,005 B2 | 8/2015 | Okuyama et al. | | |
| 9,472,342 B2 * | 10/2016 | McConnell | .......... | B23K 1/0016 |
| 2001/0013639 A1 * | 8/2001 | Abe | ....................... | H01L 22/26 257/666 |
| 2002/0187318 A1 * | 12/2002 | Yamashita | .......... | H01L 23/3737 428/209 |
| 2004/0008498 A1 * | 1/2004 | Tanaka | ............... | G06K 19/0723 361/764 |
| 2006/0027900 A1 * | 2/2006 | Takeuchi | ............ | H01L 23/4334 257/675 |
| 2008/0179382 A1 * | 7/2008 | Galvagni | ............ | B23K 1/0016 228/180.1 |
| 2008/0239621 A1 * | 10/2008 | Tajuddin | .................. | H01G 2/06 361/306.1 |
| 2008/0291602 A1 * | 11/2008 | Devoe | .................... | H01G 4/232 361/306.3 |
| 2009/0147440 A1 * | 6/2009 | Cygan | .................... | H01G 4/232 361/306.3 |
| 2010/0188798 A1 * | 7/2010 | Togashi | ................... | H01G 2/06 361/306.3 |
| 2010/0243307 A1 * | 9/2010 | McConnell | ............ | H01G 4/232 174/260 |
| 2011/0292567 A1 * | 12/2011 | McConnell | .......... | B23K 1/0016 361/321.2 |
| 2013/0087902 A1 * | 4/2013 | Do | .......................... | H01L 23/36 257/690 |
| 2013/0107419 A1 * | 5/2013 | Hill | ....................... | H01G 4/008 361/305 |
| 2013/0284501 A1 * | 10/2013 | McConnell | .......... | H05K 1/0271 174/255 |
| 2014/0002952 A1 * | 1/2014 | McConnell | .......... | B23K 1/0016 361/301.4 |
| 2014/0240940 A1 * | 8/2014 | Ito | .......................... | H05K 1/145 361/772 |
| 2015/0077905 A1 * | 3/2015 | Shin | ....................... | H01G 9/012 361/529 |
| 2015/0116910 A1 * | 4/2015 | Cho | ......................... | H01G 9/15 361/529 |
| 2015/0287670 A1 * | 10/2015 | Fukase | ................... | H05K 1/186 361/772 |
| 2017/0025223 A1 * | 1/2017 | Bultitude | ........... | B23K 35/0227 |

OTHER PUBLICATIONS

Ashburn, Travis et al., KEMET Electronics Corporation, "High Capacitance Stacked Multi-Layer Ceramic Capacitors with Robust Performance," Electronics Components, Assemblies & Materials Association, CARTS Europe, Symposium for Passive Electronics, Munich, Germany, Nov. 2010.

Veco Precision Metal, Lead Frames, retrieved from the Internet on Mar. 27, 2014 at http://www.vecoprecision.com/precision+metal/applications/precision+metal+parts/lead+frames?product_id=200.

U.S. Patent and Trademark Office, Office Action in U.S. Appl. No. 14/251,988, dated Feb. 25, 2016.

* cited by examiner

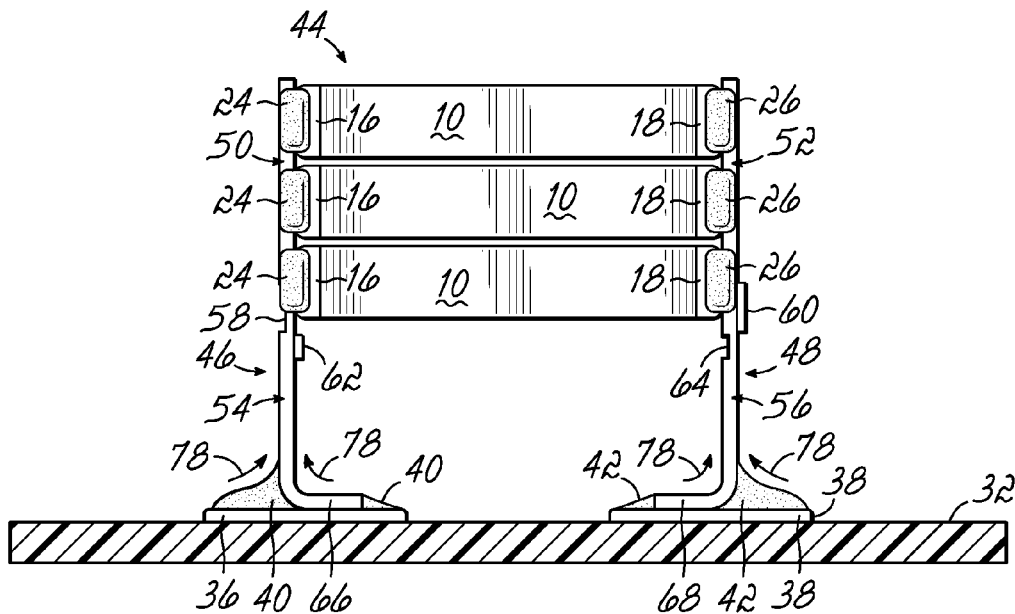
FIG. 5
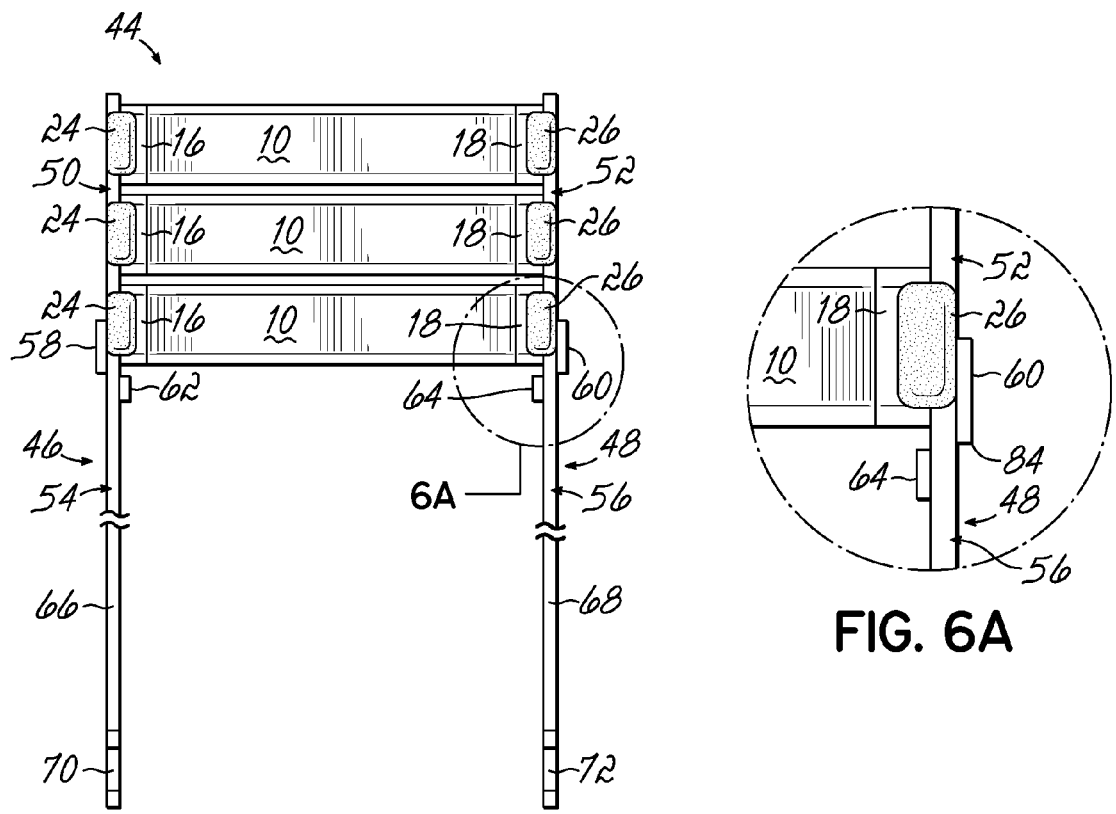
FIG. 6
FIG. 6A

ELECTRICAL DEVICES AND METHODS FOR MANUFACTURING SAME

CROSS REFERENCE

This application is a divisional of U.S. patent application Ser. No. 14/251,988 filed Apr. 14, 2014 (pending), the disclosure of which is expressly incorporated by reference herein in its entirety.

TECHNICAL FIELD

The present invention relates generally to electrical devices and methods of manufacturing electrical devices, and more particularly, to capacitor assemblies and methods of manufacturing those assemblies.

BACKGROUND

With reference to FIGS. 1 and 1A, multilayer capacitors or chips 10 are commonly used for bypass, coupling, or energy storage applications in electronic circuits. The capacitor 10 includes internal parallel plates 12 and a dielectric body 14, typically made of a ceramic. Alternating parallel plates 12 are connected by respective terminations 16, 18. Each of the end terminations 16, 18 electrically couples to corresponding plates 12 and provides an external electrical connection to the multilayer capacitor 10. As shown, in some applications multiple capacitors 10 may be stacked one on top of the other to create a combined capacitance equal to the sum of the capacitance of the individual capacitors 10. Each of the capacitors 10 in the stack may then be soldered at each end termination 16, 18 to a pair of opposing lead frames 20, 22 by corresponding solder joints 24, 26. The solder joints 24, 26 electrically and mechanically couple the individual capacitors 10 to the lead frames 20, 22 and form a stacked multilayer capacitor assembly 30.

The stacked multilayer capacitor assembly 30 may be subsequently soldered to a circuit board 32, often referred to as a printed circuit board (PCB). As is known, circuit board 32 may include a plurality of other electrical components (not shown), which may be electrically connected using conductive tracks or using other electrical connections (not shown). The circuit board 32 may include pads 36, 38 onto which the multilayer capacitor assembly 30 may be placed. Lead frames 20, 22 are soldered to the pads 36, 38 forming solder fillets 40, 42 thereby electrically connecting the stacked multilayer capacitor assembly 30 to the other electrical components on the circuit board 32.

As is known, the lead frames 20, 22 are metal and are soldered between the circuit board 32 and the multilayer capacitors 10 to provide mechanical compliance between the multilayer capacitors 10 and the circuit board 32. In this regard, the multilayer capacitors 10 often have a thermal expansion coefficient that is typically less than the circuit board 32. Consequently, during heating, the circuit board 32 expands to a greater degree than the multilayer capacitor 10. In the absence of compliance between the multilayer capacitor 10 and the circuit board 32, the multilayer capacitor 10 and/or one or more of the solder joints 24, 26 may crack or otherwise be destroyed or damaged.

Furthermore, the circuit board 32 may be more flexible than the multilayer capacitor 10. During flexing of the circuit board 32, significant mechanical stress may be applied to the multilayer capacitor 10 in the absence of the lead frames 20, 22. Lead frames 20, 22 thus provide compliance between the multilayer capacitor 10 and the circuit board 32 and allow the circuit board 32 to flex or expand upon heating while minimizing stress on the multilayer capacitors 10 and/or on the joints 24, 26.

Even with lead frames to provide compliance, manufacturers of capacitor assemblies and PCB assemblers experience failures with stacked capacitor assemblies. In particular, multilayer capacitors may be inadvertently separated from one or both of the lead frames during soldering of the multilayer capacitor to the PCB or during operation of the PCB.

While stacked capacitor assemblies have generally been successful, manufacturers strive to improve the stacked capacitor assemblies, particularly their durability and performance.

SUMMARY

The present invention overcomes the foregoing and other shortcomings and drawbacks of electrical devices and methods for manufacturing those devices heretofore known for use in electronics and other environments. While the invention will be described in connection with certain embodiments, it will be understood that the invention is not limited to these embodiments. On the contrary, the invention includes all alternatives, modifications and equivalents as may be included within the spirit and scope of the present invention.

According to one aspect of the present invention, an electrical device for soldering to a circuit board with a solder comprises a capacitor, a first lead frame including a first solder dam, and a first solder joint electrically coupling the capacitor to the first lead frame. The first solder dam includes one of a physical barrier to flow of the solder or an area of reduced wettability to the solder than a wettability of the surfaces on the remainder of the first lead frame. When the electrical device is on the circuit board for soldering with the solder, the first solder dam is between the first solder joint and the circuit board.

In one embodiment, the electrical device further comprises a second lead frame including a second solder dam, and a second solder joint electrically coupling the capacitor to the second lead frame. The second solder dam is between the second solder joint and the circuit board.

In one embodiment, each of the first solder dam and the second solder dam includes the physical barrier to flow of the solder and the area of reduced wettability to the solder.

In one embodiment, the physical barrier to flow of the solder includes the area of reduced wettability to the solder.

In one embodiment, the first lead frame includes a main portion and a lead portion extending from the main portion. The first lead frame is coupled to the capacitor proximate the main portion, and the lead portion or the main portion includes the solder dam.

In one embodiment, the first lead portion includes the first solder dam.

In one embodiment, the first solder dam extends substantially the full width of the first lead portion.

In one embodiment, the first main portion includes the first solder dam.

In one embodiment, the first solder dam extends substantially the full width of the main portion.

In one embodiment, the first lead portion extends a distance beyond the capacitor so that when the electrical device is mounted to the circuit board, the first lead portion couples the capacitor to the circuit board and there is a gap between the capacitor and the circuit board. The first solder dam is in the gap between the capacitor and the circuit board.

In one embodiment, the first lead portion further includes a second solder dam on the surface of the first lead frame generally opposite the first solder dam.

In one embodiment, the first solder dam is directly opposite the second solder dam.

In one embodiment, the second solder dam is in the gap between the capacitor and the circuit board.

In one embodiment, the first solder dam has an area of reduced wettability to the solder that includes a metal oxide. In one embodiment, the metal of the metal oxide differs from the metal of the adjacent surfaces of the lead portion.

In one embodiment, the first solder dam includes a physical barrier in the configuration of a recess.

In one embodiment, the recess is sand-blasted, scratched, chemically leached, or laser ablated into the surface of the lead portion.

In one embodiment, the first solder dam includes a non-solderable layer.

In one embodiment, the electrical device further includes a layer of the solder on the first lead frame that is spaced apart from the first solder joint by the first solder dam.

In one embodiment, a circuit board includes the electronic device as described herein.

According to one aspect of the present invention, a method of manufacturing an electrical device for soldering to a circuit board with a first solder comprises soldering a first lead frame to a multilayer capacitor with a second solder and modifying a surface portion on the first lead frame. When the electrical device is soldered to the circuit board with the first solder, the surface portion is between the joint formed by the second solder and the circuit board. The surface portion includes one of a physical barrier to the flow of the first solder or an area of reduced wettability with the first solder as compared to the wettability of the first lead frame and the second lead frame with the first solder.

In one embodiment, the first lead frame includes an outer plating layer configured to facilitate soldering with the first solder, and modifying the surface portion includes removing the outer plating layer to form a recess and exposing a different underlying metal on the first lead frame.

In one embodiment, modifying the surface portion includes forming the area of reduced wettability by oxidizing a metal in the first lead frame.

In one embodiment, the second solder has a higher melting point than the first solder.

In one embodiment, modifying the surface portion includes applying a physical barrier in the form of a non-solderable coating to the first lead frame.

In one embodiment, modifying the surface portion precedes soldering the first lead frame to the multilayer capacitor.

The advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 5 is a side elevation view of an electronic device after soldering to a circuit board according to one embodiment of the invention;

FIG. 6 is a side elevation view of an electronic device prior to soldering to a circuit board according to one embodiment of the invention;

FIG. 6A is an enlarged view of the encircled area 6A of FIG. 6 depicting one embodiment of a solder dam;

DETAILED DESCRIPTION

Figure 1:
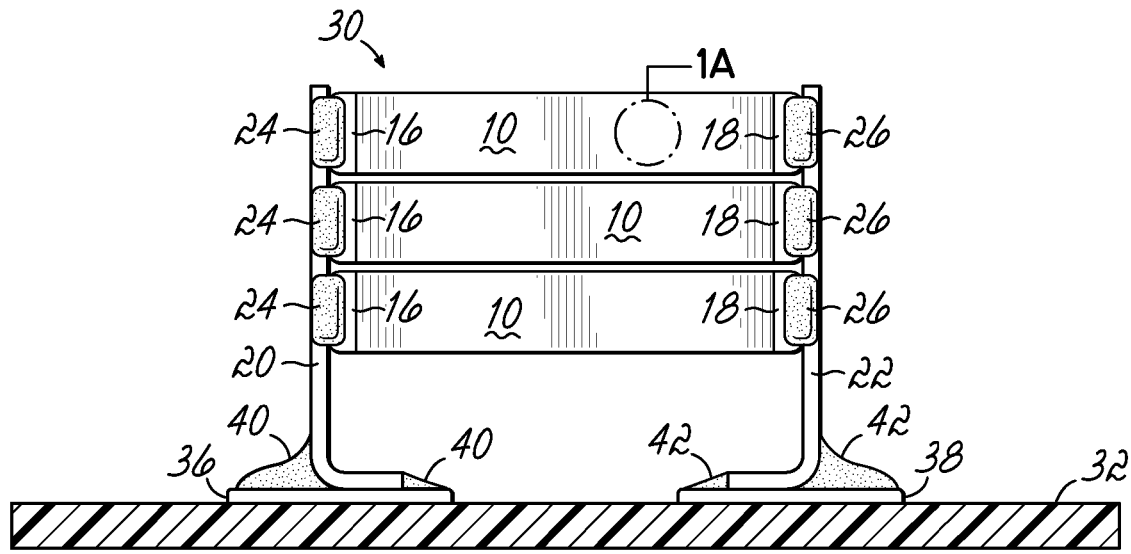
FIG. 1 is a side elevation view an electronic device soldered to a circuit board according to the prior art.
Figure 1A:
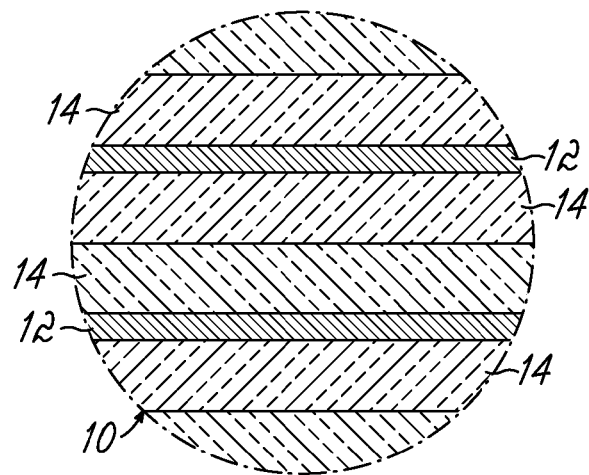
FIG. 1A is an enlarged cross-sectional view of the encircled area 1A of FIG. 1.

It is known that manufacturing an electrical device and attachment of that device to a circuit board may include a two stage soldering process. The solders in each of the two stages may be different. With reference to FIG. 1, in one exemplary process using a capacitor assembly 30 (described above), a high temperature solder is used to attach a pair of lead frames 20, 22 to one or more multilayer capacitors or chips 10, as is described above.

In the second stage, the stacked capacitor assembly 30 may be soldered to the circuit board 32. A low temperature solder may used to mount the assembly 30 to the circuit board 32. There are numerous processes by which a stacked capacitor assembly 30 may be soldered to the circuit board pads 36, 38 with the low temperature solder. Exemplary soldering processes include, but are not limited to, manual soldering, wave soldering, and reflow soldering, among others.

Generally, the high temperature solder of the first stage is characterized by higher liquidus temperature than the liquidus temperature of the low temperature solder of the second stage. Thus, the joints 24, 26 formed during manufacturing of the capacitor assembly 30 should not melt as a result of being inadvertently heated during the subsequent lower-temperature mounting process. However, notwithstanding the specific high-then-low soldering temperatures, the joints 24, 26 formed of high temperature solder too often fail as a result of mounting the capacitor assembly 30 to the circuit board 32 with the low temperature solder.

It is contemplated that the integrity of the joints 24, 26 may be compromised if the low temperature solder comes into contact with the high temperature solder during processing. Contact between the two solders may occur during soldering of the assembly 30 to the circuit board 32. Should there be contact between the high temperature solder and the low temperature solder, the assembly 30 and ultimately the circuit board 32 to which the assembly 30 is attached may eventually become inoperable.

Specifically, during a soldering process by which solder joints or fillets 40, 42 are formed between the lead frames 20, 22 and the corresponding pad 36, 38, the low temperature solder that is to form one or both of the fillets 40, 42 can flow from the region including the fillets 40, 42 into contact with one or more of the solder joints 24, 26. This may be the result if excess supply of low temperature solder is used and/or if the assembly 30 is exposed for too long and/or at too high a temperature during the second stage of soldering. In this case, excess low temperature solder may accidently flow into one or more of the solder joints 24, 26.

It is contemplated that contact between the low temperature solder used to form the fillets 40, 42 and the high temperature solder that is used to form the joints 24, 26 can ultimately result in mechanical failure of one or more of the solder joints 24, 26. In this regard, it is believed that the low temperature solder may eventually alloy with the high temperature solder at the temperatures observed during soldering, and even at the temperatures observed during operation of the circuit board 32. The resulting alloy may have a lower melting temperature than the melting temperature of even the low temperature solder alloy. Under certain conditions, the solder alloy of the combination of the low temperature and high temperature solder may have a liquidus temperature that may be at or below the operating temperature of the joints 24, 26 during use of the circuit board 32. As a consequence, operation of the circuit board 32 may cause mechanical failure of the assembly 30 because one or more of the joints 24, 26 eventually melts or softens.

Specifically, during the process of manufacturing the stacked capacitor assembly 30, the solder used to form the joints 24, 26 may be a high temperature solder. By way of example, and not limitation, the high temperature solder may be a high lead alloy, such as a tin (Sn)-lead (Pb)-silver (Ag) alloy (e.g., 10Sn/88Pb/2Ag) and may be heated to a temperature of about 330° C. during reflow by which the lead frames 20, 22 are soldered to the chips 10. The high temperature solder forms the joints 24, 26 upon cooling.

Subsequent to the construction of the stacked capacitor assembly 30, a solder having a lower reflow temperature than the reflow temperature of the high temperature solder may be utilized to attach the assembly 30 to the circuit board 32 and to form the fillets 40, 42. By way of example, and not limitation, the low temperature solder may be a high tin solder, such as a tin (Sn)-silver (Ag) alloy (e.g., 96Sn/4Ag) or a tin (Sn)-lead (Pb) alloy (e.g., 63Sn/37Pb) and may be heated to a temperature of between about 220° C. and about 260° C. during reflow by which the stacked capacitor assembly 30 is soldered to the circuit board 32.

Contact between the low temperature solder and the high temperature solder may result in a low melting temperature alloy. By way of example, according to a phase diagram for Sn—Pb, changing the relative amounts of Pb and Sn in the high temperature solder may produce a new alloy that at least partially melts at a lower temperature. For example, an eutectic is formed between Sn and Pb at approximately 61.9 wt. % Pb and 38.1 wt. % Sn, the composition of which melts at a temperature of about 183° C. Thus, depending upon the composition of the new alloy, it may melt at a lower temperature than either of the high temperature solder or the low temperature solder. This may cause problems with the joints 24, 26 during the mounting procedure and afterwards if heated to at or near the melting temperature of the new alloy.

During use of the circuit board 32, the joints 24, 26 may fail because the new alloy may have a liquidus temperature at or near the temperature of the joints 24, 26 during operation of the circuit board 32. Thus, it is believed that contact between the high temperature solder alloy of the joints 24, 26 and the low temperature solder may have a catastrophic effect on the joints 24, 26 and thus shorten the life span of the assembly 30. While specific high temperature and low temperature solder alloys are described herein, it will be appreciated that the alloying problem described above is not limited to combinations of these particular high temperature solders and low temperature solders, as other solder alloys having differing liquidus temperatures when brought into contact with one another may produce similar catastrophic effects during operation of the circuit board.

Figure 2A:
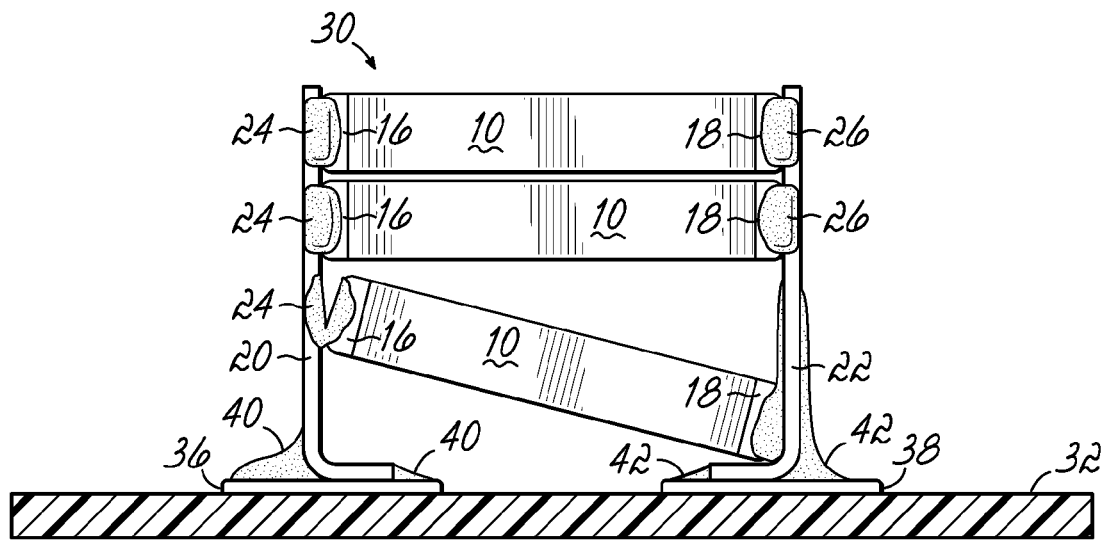
FIG. 2A is an elevation view an electronic device having a failed solder joint between a frame and a chip according to the prior art.
Figure 2B:
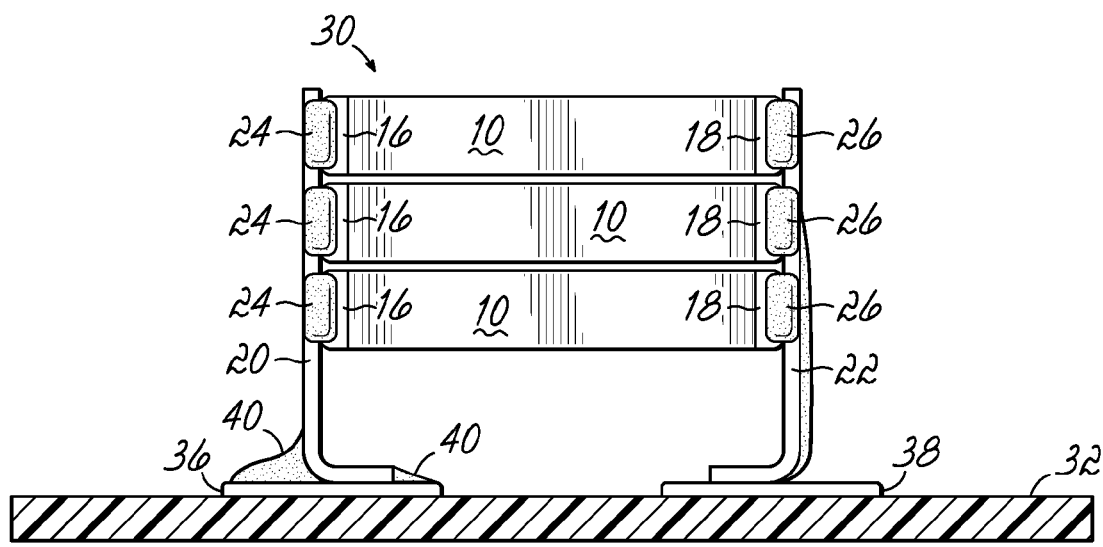
FIG. 2B is an elevation view of an electronic device having a failed solder joint between a frame and a pad according to the prior art.
Figure 3:
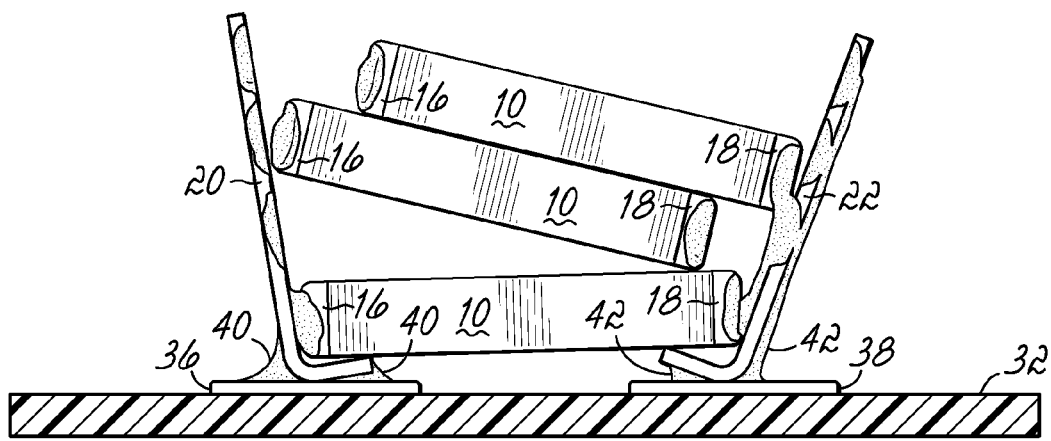
FIG. 3 is a side elevation view an electronic device having multiple failed solder joints according to the prior art.

Exemplary catastrophic failures of the assembly 30 are depicted schematically in FIGS. 2A, 2B, and 3. As a result of contact between the lower temperature solder alloy and the solder joints 24, 26, the joints 24, 26 may gradually melt or otherwise fail at undesirably low temperatures. As is shown in FIG. 2A, the lowermost chip 10 may slump onto the circuit board 32 when contact between the low temperature solder and the joint 26 of the lowermost chip 10 causes the joint 26 to melt when the circuit board 32 is in use. The lowermost chip 10, in the absence of the joint 26 and under the influence of gravity, may be pulled onto the circuit board 32 and may thus disconnect from the lead frame 22 or form a high-resistance connection to the lead frame which degrades the operation of the overall assembly.

In FIG. 2B, the solder may migrate or wick up a lead frame 22 and starve the joint between the lead frame 22 and the pad 38. As a result, a fillet 42 (FIG. 2A) does not form and the frame 22 may only be weakly secured to the pad 38. Ultimately, the assembly 30 may disconnect from the circuit board 32 or the frame 22 may only periodically contact the pad 38 resulting in an unreliable or high resistance electrical connection with the pad 38.

Another possible catastrophic failure is shown in FIG. 3 in which the assembly 30 falls apart. As shown, the lead frame 22 may tilt away from the chips 10. One result may be that each lead frame 20, 22 loses contact with each chip 10 or forms only high resistance connections to each chip. That is, each solder joint 24, 26 on each chip 10 fails.

In view of the alloying of the different solders and associated problems, as identified in the preceding paragraphs, embodiments of the present invention include a solder dam configured to keep a solder (e.g., a high temperature solder) utilized to assemble an electrical device from coming into contact with a solder of different composition (e.g., a low temperature solder) utilized to assemble the electrical device with a substrate, such as a circuit board.

To that and other ends, the solder dam may act as a barrier that stops flow or resists flow of liquid solder or diffusion on selected surfaces of an electronic device, such as, a stacked multilayer capacitor assembly. In this regard and as is described in detail below, embodiments of the present invention may include a stacked multilayer capacitor assembly having one or more solder dams. Solder dams according to embodiments of the present invention may include an area over which the liquid solder is prohibited or at least inhibited from flowing. An exemplary solder dam may include a region of reduced wettability to the solder and/or one or more physical barriers that stop or reduce the flow of the liquid solder, each of which is described below.

As is known in the art, wettability describes the relationship between a solid and a liquid in contact with the solid and depends upon the interfacial energies between the liquid, a vapor, and the solid. If the solid-liquid interfacial energy is high, the liquid will not "wet" the surface and tends to form a ball-shape having a small interfacial area with the surface. In contrast, if the solid-vapor interfacial energy is high (or the solid-liquid interfacial energy is low), the liquid will tend to spontaneously spread out on the surface. Generally, the degree to which a liquid wets a solid is quantified by a contact angle, which is an angle measured between the solid surface and the liquid surface at the interface between the solid, the liquid, and the vapor. A measured contact angle of 0° indicates that the liquid spontaneously flows across the solid surface. As the contact angle increases from 0°, the liquid's tendency to spread along a solid's surface is reduced. For measured contact angles of greater than 0° to 90°, the liquid is described as "wetting" the surface, and for measured contact angles greater than 90°, the liquid is described as "non-wetting." Thus, embodiments of the electrical device according to the present invention may include a solder dam having a surface that is nonwettable to the liquid solder adjacent a surface that is wettable or include a surface that has reduced wettability to the liquid solder adjacent a surface that is more wettable.

In addition or as an alternative to relative differences in interfacial energies to affect the wettability, the solder dam may include a physical barrier to the flow of liquid solder. Physical barriers may include a feature over which the liquid solder does not readily flow. By way of example, these features may include a ridge that extends above the surrounding surface or a recess that reside below the surrounding surface of the lead frame. Physical barriers may completely block flow of liquid solder or may slow the flow of liquid solder.

As a result of the solder dam, and by way of example, it is contemplated that during a surface mount operation the solder utilized to connect the electrical device to the substrate is prevented or at least inhibited by the area of reduced wettability and/or physical barrier to a degree sufficient to prevent the solder from flowing into contact with another solder already present on the electrical device. No low temperature alloy is thus formed. According to embodiments of the invention, whether including a solder dam having an area of reduced wettability and/or having features over which solder is inhibited from flowing, the solder dam may not completely stop solder flow. Nevertheless, the solder dam effectively prevents contact between solders of different compositions during a mounting operation of the electrical device to a substrate. For example, the solder dam effectively prevents a low temperature solder used for surface mounting of an electrical device from coming into contact with a high temperature solder used in the assembly of the electrical device. Accordingly, the solder dam is located on the electrical device between the two solders.

Figure 4:
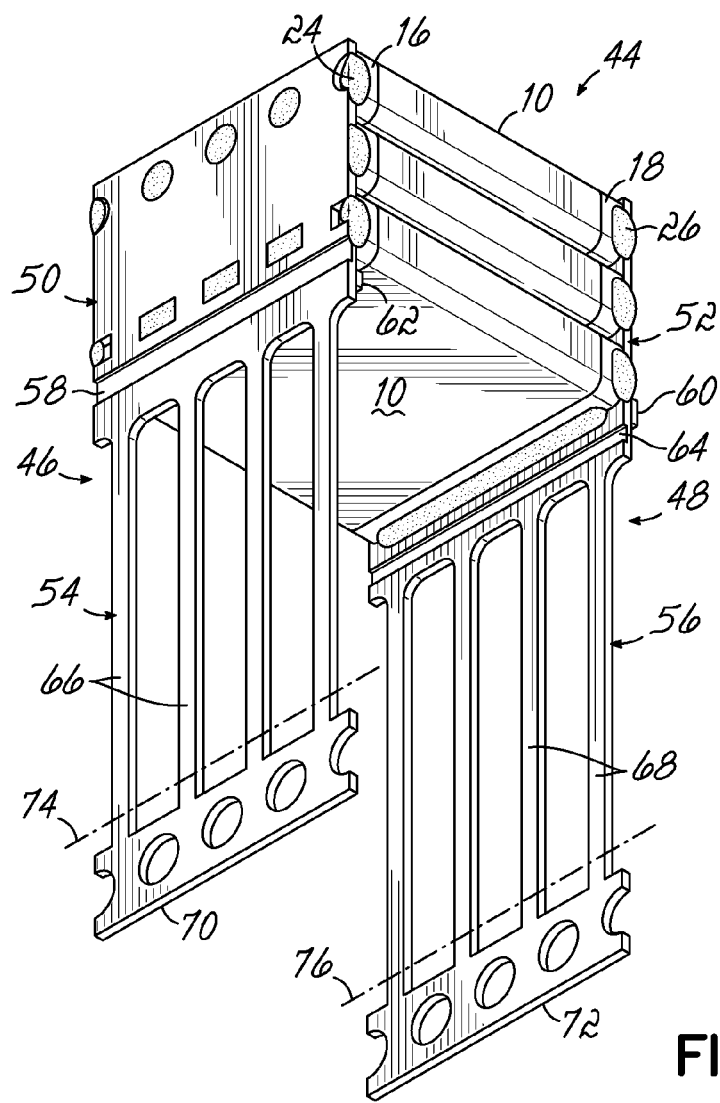
FIG. 4 is a perspective view of an electronic device according to one embodiment of the invention.

In particular, with reference now to FIG. 4, in which like features are indicated by like numerals throughout the figures, in one embodiment of the invention, a stacked multilayer capacitor assembly 44 includes one or more multilayer capacitors or chips 10 as described above and depicted in FIG. 1. The stacked multilayer capacitor assembly 44 includes opposing lead frames 46, 48. The chips 10 are coupled to the lead frames 46, 48 by respective solder joints 24, 26. The solder joints 24, 26 may each be formed of a high temperature solder, such as, a high lead alloy described above. The joints 24, 26 may electrically couple the chips 10 at their respective end terminations 16, 18 to the corresponding lead frame 46, 48. Each lead frame 46, 48 is metallic and may be about 250 μm thick.

Specifically, as is known in the art, lead frames may be constructed from a flat sheet of metal that may be stamped, electroformed, or photo etched to the desired configuration. By way of example only, the metal of each of the lead frames 46, 48 may be a nickel-iron alloy (e.g., FeNi42 referred to as Alloy 42 or Kovar®, a trademark of CRS Holdings, Inc.), copper, a copper alloy, a phosphorous-copper-tin alloy, silver, or a beryllium-copper alloy, to name a few. The lead frames 46, 48 may also include one or more plating layers over a core of the above-identified metals. Embodiments of the present invention are not, however, limited to the material of the lead frames 46, 48 or any coatings that are plated or otherwise coated onto a core metal to form the lead frames 46, 48.

As shown in FIG. 4, in one embodiment, each lead frame 46, 48 may include one or more solder dams 58, 60, 62, 64. Exemplary solder dams 58, 60, 62, and 64 may be a result of adding material, of removing material, or otherwise processing the surface of the lead frame 46, 48 as described below. These processes may form a physical barrier, such as a ridge on the surface of the lead frame 46, 48 or a recess in the surface of the lead frame 46, 48, each described in detail below. Further, the ridge or recess may include a surface of reduce wettability. However, it will be appreciated that the physical barrier to liquid solder flow may be utilized alone, that is, without a surface of reduced wettability.

The location of the solder dams 58, 60, 62, and 64 may vary on each of the interior surface (i.e. between the opposing lead frames 46, 48) and the exterior surface (i.e., the outwardly-facing surfaces of the lead frames 46, 48). However, the solder dams 58, 60, 62, and 64 are located between the joints 24, 26 and the location onto which a second solder is used to couple the lead frames 46, 48 to a circuit board.

In this regard, each lead frame 46, 48 may include a main portion 50, 52 and one or more lead portions 54, 56. The solder dams 58, 60, 62, 64 may be located on the main portions 50, 52 and/or each lead portion 54, 56, as described below. While the figures depict lead frames 46, 48 having the solder dam on each one of the interior surface and the exterior surface, embodiments of the present invention are not limited to having solder dams on each surface. It will be appreciated that the solder dams 58, 60, 62, 64 may be used in any combination on any one or more of interior and exterior surfaces of the lead frames 46, 48.

In one embodiment, the solder dam 58, 60, 62, 64, reduces the flow rate of the liquid solder upward along the surface of the lead frame 46, 48. The reduction in flow rate may be sufficient to eliminate or significantly reduce the quantity of contact between the liquid solder and the joints 24, 26 during the time a circuit board is exposed to the liquid solder. In particular, it is noted that the liquid solder may cross the solder dam 58, 60, 62, 64 during the soldering operation yet the solder dam 58, 60, 62, 64 slows the flow rate by an amount sufficient to prevent contact with the joints 24, 26 during the soldering process. By way of example only, the solder dam 58, 60, 62, 64 may prevent contact between the joints 24, 26 with the liquid solder for a period of up to 120 seconds, for a period of about 90 seconds or less, for a period of about 45 seconds or less, for a period of 25 seconds or less, or for a period of from about 20 to about 25 seconds during soldering of the assembly to the circuit board 32.

The stacked multilayer capacitor assembly 44 may be exposed to multiple mounting procedures in the event that an initial mounting procedure fails to solder one or more components onto the circuit board 32. Even in view of the reduction in the flow rate of liquid solder past the solder dam 58, 60, 62, 64, it will be appreciated that, given a long enough time at a high enough temperature and/or a sufficient amount of solder, the solder may flow across the solder dam 58, 60, 62, 64. Nevertheless, in mounting operations in which one or more of the time, temperature, and the amount of solder is poorly controlled, embodiments of the present invention may eliminate or significantly reduce the frequency of contact between the liquid solder and the joints 24, 26. Embodiments of the present invention may therefore eliminate or reduce contact between the liquid solder and the joints 24, 26 for at least one mounting process. Further, the solder dam 58, 60, 62, 64 may limit flow over multiple mounting operations and may reduce or eliminate contact between the liquid solder and the joints 24, 26 during each procedure. By way of example, the solder dam 58, 60, 62, 64 may limit flow for at least two mounting procedures and by way of additional example the solder dam 58, 60, 62, 64 may limit flow for at least three mounting procedures.

To that end, the solder dams 58, 60, 62, and 64 may reduce the flow of liquid solder. Exemplary solder dams 58, 60, 62, and 64 may be the result of surface modification of the lead frame 46, 48 and include either of material added to the surface of the lead frame 46, 48 or material removed from the surface of the lead frame 46, 48. Specifically, for example, the solder dams 58, 60, 62, 64 may be in the form of a ridge projecting outwardly relative to the surrounding surface of the respective lead frame 46, 48 (shown best in FIGS. 6 and 6A). Alternatively, for example, the solder dams 58, 60, 62, and 64 may be in the configuration of a recess in the lead frame 46, 48 (shown best in FIGS. 7A-7C) that may be formed generally by removing material. Each of these configurations is described in more detail below. The recess and ridge slows the flow of molten solder upward along the surface of the lead frames 46, 48 and prevents contact between the liquid solder and the joints 24, 26 during a mounting process.

Each of the ridge or recess may include an area of reduced wettability that, in combination, reduces the flow of the liquid solder relative to the surface of the lead frames 46, 48. However, it will be appreciated that either the area of reduced wettability or the physical barrier alone may be sufficient to reduce the flow of solder and prevent contact between a liquid solder and an existing solder joint. Embodiments of the present invention may not include both the physical barrier and an area of reduced wettability.

As described above and with regard to wettability, unlike the surfaces of the lead frame 46, 48, the solder dam 58, 60, 62, 64 may include a surface area that may be non-wetting (forms a contact angle of 90° or more) to the solder. Alternatively, the molten solder may form a contact angle of less than 90° with a surface area of the solder dam 58, 60, 62, 64. That is, the liquid solder may wet the solder dam 58, 60, 62, 64 but only to a lesser degree than the surface of the lead frames 46, 48. The contact angle of the molten solder in contact with the solder dam 58, 60, 62, 64 may be greater than the contact angle formed between the molten solder and the surface of lead frames 46, 48.

By way of example and not limitation, the solder may form a contact angle with the solder dam 58, 60, 62, 64 that is about 10% greater than the contact angle formed between the molten solder and the surface of the lead frame 46, 48 and by way of additional example, the molten solder may form a contact angle with the solder dam 58, 60, 62, 64 that is about 20% greater than the contact angle formed between the molten solder and the surface of the lead frame 46, 48. This difference in wettability slows the flow of molten solder upward along the surface of the lead frames 46, 48 relative to a lead frame lacking the area of reduced wettability.

Now with further detail as to the location of the solder dams 58, 60, 62, 64, as is described above and with reference to FIGS. 4 and 5, in one embodiment of the invention, the solder dams 58, 60, 62, 64 may be located between the joints 24, 26 and the circuit board 32 when the stacked multilayer capacitor assembly 44 is placed onto the circuit board 32 for mounting thereon. More specifically, in one embodiment, the main portion 50, 52 includes one or more solder dams 58, 60, 62, 64. The location of the solder dams 58 and/or 60 is not, however, limited to placement in or on the main portion 50, 52 (as shown), as other locations between the solder joints 24, 26 and the circuit board 32 are possible which will be in the pathway of any liquid solder that may wick upward along the lead portions 54, 56 toward the solder joints 24, 26.

In this regard and with continued reference to FIGS. 4 and 5, in one embodiment, each lead portion 54, 56 may include the corresponding foot 66, 68 that ultimately forms the contact area that will touch the circuit board 32, and specifically contact with the pads 36, 38 (FIG. 5). The feet 66, 68 are spaced apart and are at the other end of the lead frame 46, 48 from the main portion 50, 52. The feet 66, 68 may be soldered to the pads 36, 38 with a low temperature solder during, for example, a wave soldering process.

In the embodiment shown in FIG. 4, collectively, the feet 66, 68 of each lead frame 46, 48 are formed with a retainer 70, 72. The retainers 70, 72 may ensure that each of the lead portions 54, 56 remains straight (i.e., does not get bent) during handling of the stacked multilayer capacitor assembly 44. The retainer 70, 72 may eventually be removed by cutting each lead frame 46, 48 along exemplary line 74, 76 prior to soldering the stacked multilayer capacitor assembly 44 to a circuit board.

By separating the lead portions 54, 56 from the retainer 70, 72, each lead portion 54, 56 may then be separately secured to the circuit board 32. It will be appreciated that the feet 66, 68 may be bent prior to being soldered to the pads 36, 38, respectively. In this regard, lead portions 54, 56 may be referred to as "J" style (shown in FIG. 5), "L" style, or "Z" style leads as are known in the art. Other styles may include "N" style or "P" style though embodiments of the present invention are not limited to any particular style of lead as other configurations are possible.

In view of the above and with reference to FIG. 5, solder dams 58, 60, 62, 64 may be positioned on the lead frames 46, 48 between the joints 24, 26 and the feet 66, 68. Placement of the solder dams 58, 60, 62, 64 may vary between the interior surfaces and the exterior surfaces of the lead frames 46, 48 as well.

As is shown in FIG. 5, the solder dams 58, 60, 62, 64 are positioned between the feet 66, 68 and the joints 24, 26. Solder that wicks up the lead portions 54, 56 (as indicated by arrows 78) on the inside and outside of the lead frames 46, 48 during formation of the fillets 40, 42 is prevented or at least inhibited from contacting the joints 24, 26 during mounting of the stacked multilayer capacitor assembly 44 to the circuit board 32 or during another process. In particular, the interior solder dams 62, 64 may be positioned on the interior of the corresponding lead frames 46, 48 between the lowermost chip 10 and the circuit board 32. Because the distance between the lowermost chip 10 and the circuit board 32 is limited, by way of example, this gap may be 0.045 inches or less. The interior solder dams 62, 64 may therefore be positioned on the corresponding lead portion 54, 56. The exterior solder dams 58, 60 may be positioned on the lead portion 54, 56 or the main portion 50, 52. Due to the relative space limitations, the solder dams 58, 60, 62, 64 between the inside and the outside of the lead portions 54, 56 may be different both in dimension and in shape.

Specifically, and with reference to FIGS. 6 and 6A, due to the limited space on the interior surface of the lead portions 54, 56, the solder dams 62, 64 positioned on the interior surface may have a smaller overall dimension in the direction of potential solder flow (indicated by arrows 78 in FIG. 5). The solder dams 58, 60 on the exterior of the lead frames 46, 48 may not be so limited in dimension or in location. Generally, the solder dams 58, 60 may be larger than the corresponding solder dams 62, 64 on the interior surfaces of the lead frames 46, 48. Although not shown, large areas of the exterior surfaces of the lead frames 46, 48 may include solder dams 58, 60. It may be possible, for example, for one or both of the solder dams 62, 64 to encompass the entire main portion 50, 52 with or without covering portions of the lead portions 54, 56.

Furthermore, the solder dams 58, 60 on the exterior of the lead frames 46, 48 may be positioned directly across from the interior solder dams 62, 64, the exterior solder dams 58, 60 may be positioned closer to the feet 66, 68 than the solder dams 62, 64, or directly across from the lowermost joints 24, 26, or the relative placement of the solder dams 58, 60 may be a combination of these locations. The interior and exterior solder dams 58, 60 and 62, 64, respectively, may also differ in configuration as is described in detail below.

In addition to the advantages described above during the mounting process of the assembly 44 to the circuit board 32, embodiments of the present invention inhibit flow of a preexisting low temperature solder (not shown) on the feet 66, 68 from flowing toward the chips 10 during formation of the joints 24, 26. In this regard, one method of manufacturing the stacked capacitor assembly 44 is to solder the lead frames 46, 48 having a pre-coating of low temperature solder on the feet 66, 68 to the chips 10. A pre-coating of solder on the lead frames 46, 48 may be provided by the lead frame manufacturer to simplify the subsequent mounting process of the stacked capacitor assembly 44 to the circuit board 32. During this type of manufacturing of the stacked capacitor assembly 44 with precoated lead frames 46, 48, the feet 66, 68 are typically oriented to project above the chips 10. This orientation may be referred to as "dead bug" style.

In this dead bug style, a high temperature solder may be used to form the joints 24, 26. As is described above, to solder the chips 10 to the lead frames 46, 48 with a high temperature solder requires reflow temperatures greater than the liquidus temperature of the preexisting low temperature solder. At these higher temperatures, the preexisting low temperature solder on the feet 66, 68 may be heated to above its liquidus temperature and thus the preexisting low temperature solder may melt and flow down toward the joints 24, 26 during their formation. As with the alloying problems described in conjunction with FIGS. 2 and 3, manufacturing of the stacked capacitor assembly 44 in dead bug style with a preexisting low temperature solder is similarly problematic due to a lower temperature alloy formation.

Embodiments of the present invention are advantageous because the solder dams 58, 60, 62, 64 may prevent the preexisting low temperature solder from flowing down the lead frame 46, 48 and into contact with the joints 24, 26 as they are being formed with the high temperature solder. Thus, embodiments of the present invention may include stacked capacitor assemblies 44 having a low temperature solder covering at least a portion of the lead portions 54, 56, particularly, but not limited to, the feet 66, 68.

As described above, each solder dam 58, 60, 62, 64 may be the result of modifying a surface portion of the lead frame 46, 48. Modification may include removing material from the surface of the lead frames 46, 48 or adding material to the frames 46, 48. In this regard, in one embodiment, solder dams 58, 60, 62, 64 may each be a recess (material removed relative to the lead frames 46, 48) or a ridge (material added to the lead frames 46, 48) on the interior and/or exterior surfaces of the lead frames 46, 48.

In this regard and with reference to FIGS. 5, 6, and 6A, one or more the solder dams 58, 60, 62, 64 may be a ridge of material added to the surface of the lead frames 46, 48. Each of the solder dams 58, 60, 62, 64 shown in FIG. 6 is a ridge. The shape of the ridge slows liquid solder flow. For example, the ridge may be defined at least in part by at least one sharp corner 84 over which liquid solder may not readily flow. The sharp corners of the rectangular cross-sectional configuration that project outwardly relative to the surrounding surface may inhibit movement of the liquid solder over the ridge. While a rectangular cross-sectional configuration is shown in FIGS. 6 and 6A, embodiments of the ridge are not limited to a rectangular cross-sectional configuration as there are other cross-section configurations having sharp corners or other features that slow the flow of liquid solder.

In one exemplary process, the ridge may be formed by plating or spraying the surface of the lead frame 46, 48 so as to add material to the surface of the lead frame 46, 48. The lead frame 46, 48 may be sprayed prior to soldering the chips 10 to the lead frames 46, 48. Spraying or plating may therefore be performed by the lead frame manufacturer. Alternatively, the lead frame 46, 48 may be sprayed or plated following manufacturing of the stacked capacitor assembly 44. In this case, the manufacturer of the stacked capacitor assembly may coat one or both of the lead frames 46, 48 prior to assembly or subsequent to soldering the chips 10 to the lead frames 46, 48. The material of the ridge may be a polymer-containing material, such as, an epoxy, an acrylic, or paralene (also known as Parylene) (unsubstituted poly (para-xylylene), e.g., Parylene N, and substituted poly(para-xylylene), e.g., Parylene C and Parylene D), and polytetrafluoroethylene (PTFE), to name a few. In one embodiment, the ridge may project at least about 100 microinches (about 0.0001 inch) outwardly from the surrounding surfaces of the lead frame 46, 48. In another embodiment, the ridge may project from about 100 microinches (about 0.0001 inch) to about 1 mil (about 0.001 inch) outwardly from the surface of the lead frame 46, 48. In yet another embodiment, the ridge may project from about 1 μm (about $3.94 \times 10^{-5}$ inch) to about 10 μm (about 0.000394 inch) outwardly from the surface of the lead frame 46, 48. (In view of these exemplary dimensions, it will be appreciated that the figures may not be drawn to scale.) In one embodiment, the ridge includes at least one surface area of non-wettability or of reduced wettability to liquid solder flow.

Figure 7A:
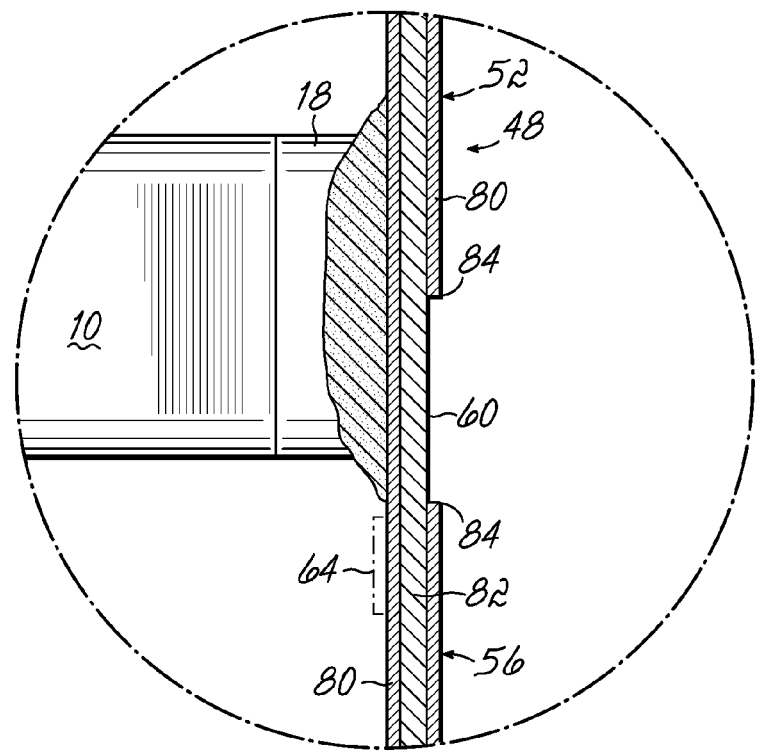
FIGS. 7A, 7B, and 7C are an enlarged views of the encircled area of FIG. 6 depicting various embodiments of a solder dam according to the present invention.

With reference now to FIGS. 5 and 7A-7C, in one embodiment, at least one of the solder dams 58, 60, 62, 64 is a recess in the surface of at least one of the lead frames 46 and 48. With reference specifically to FIG. 7A, the recess 60 may be a depression or slot in the surface of the lead frame 46. In one embodiment, the recess may be at least about 100 microinches (about 0.0001 inch) deep. In another embodiment, the recess may be from about 100 microinches (about 0.0001 inch) deep to about 1 mil (about 0.001 inch) deep. In yet another embodiment, the recess may be from about 1 μm (about $3.94 \times 10^{-5}$ inch) deep to about 10 μm (about 0.000394 inch) deep. (In view of these exemplary depths, it will be appreciated that the figures may not be drawn to scale.) The shape of the recess slows liquid solder flow. For example, the recess may be defined at least in part by at least one sharp corner 84 over which liquid solder may not readily flow. The sharp corners of the rectangular cross-sectional configuration that are positioned inwardly relative to the surrounding surface may inhibit movement of the liquid solder over the recess. While a rectangular cross-sectional configuration is shown in FIG. 7, embodiments of the recess are not limited to a rectangular cross-sectional configuration as there are other cross-section configurations having sharp corners or other features that slow the flow of liquid solder.

In one embodiment, one surface of the recess 60 may include an area of non-wettability or an area of reduced wettability compared to the surface of the lead frames 46, 48. It will be appreciated that the recess with or without an area of reduced wettability to the liquid solder, may act as a physical boundary to liquid solder flow. There may be many processes by which the recess may be formed.

The recess may be formed by a machining process in which material is removed from the lead frames 46, 48. In one exemplary process, the recess may be formed by sandblasting the surface of the lead frame 48 so as to remove metal from the surface of the lead frame 48. The lead frame 48 may be sandblasted prior to soldering the chips 10 to the lead frames 46, 48. Sandblasting may therefore be performed by the lead frame manufacturer.

Alternatively, the lead frame 48 may be sand blasted following manufacturing of the stacked capacitor assembly 44. In this case, the manufacturer of the stacked capacitor assembly may sand blast the lead frame 48 prior to assembly or subsequent to soldering the chips 10 to the lead frames 46, 48.

In one embodiment and with reference to FIG. 7A, sandblasting may be used to remove a plated layer 80 from a core material 82 thereby exposing the core material 82 within the recess. The plated layer 80 may be about 100 microinches thick. So, sandblasting may just remove the plated layer 80 with minimal removal of the core material 82. It will be appreciated however that sandblasting may remove a significant proportion of the core material 82 as well, which may result in depths in excess of 100 microinches.

In one embodiment, to control the location of the solder dam formed by sandblasting, a masking material may be used to protect areas of the lead frames 46, 48. The masking material may be adhesive tape, which could be peeled off after sandblasting is complete, or an organic polymer, which may be subsequently removed with a solvent or by other means. The recess may be formed by other methods.

By way of additional example, many lead frames are manufactured by an etching process in which the metallic sheet is etched into the shape of the lead frame using a laser or chemicals, such as, an acid bath. This etching process may be used to form the recess as a separate additional etching process or in conjunction with forming the lead frame itself. Specifically, the etching process may be utilized to remove all or a portion of the plated layer 80 from the core material 82.

Figure 7B:
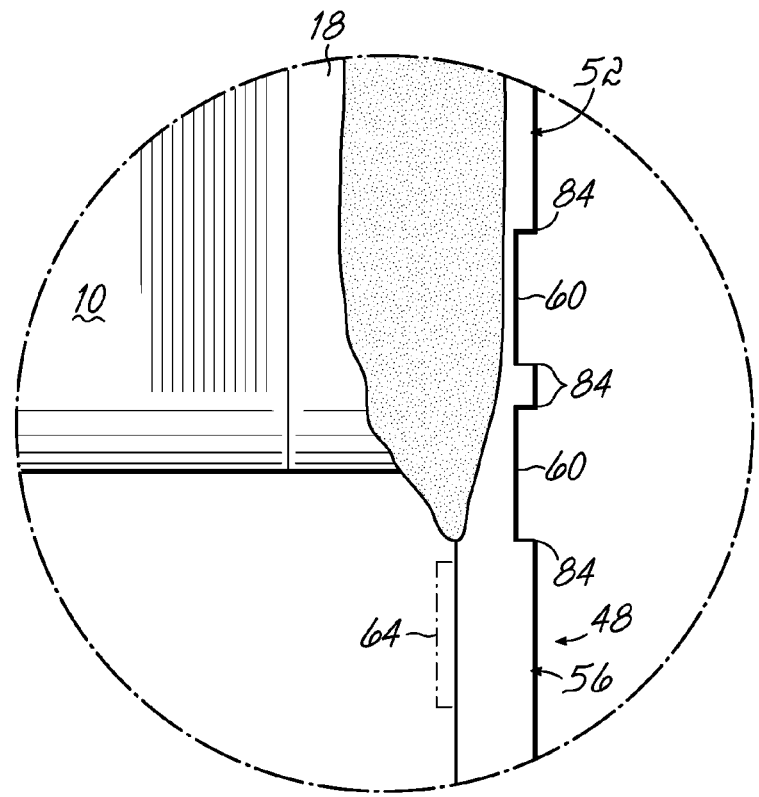
Figure 7C:
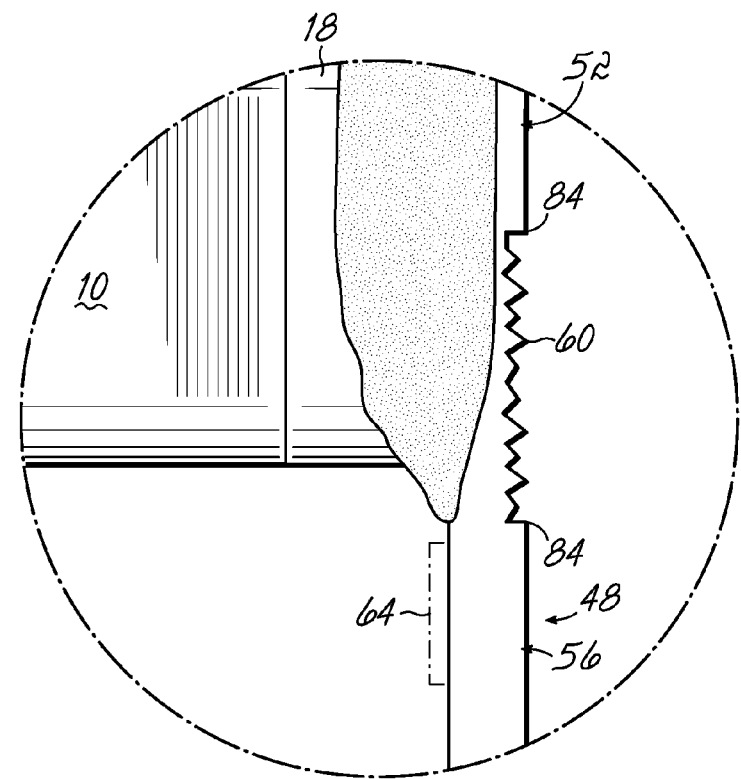

In another exemplary process, the lead frame 46, 48 may be scraped or scratched to remove an outer layer of the lead frame 46, 48. This may result in a roughened topology as is shown in FIG. 7C.

As yet another example of forming the recess, during manufacturing of the lead frame, an organic coating (not shown), such as, a silicone-based material, a polyimide-based material, or a paralene material may be used to mask an area of a core material 82 where the recess is to be formed while leaving a remaining area of the core material 82 exposed. The core material 82 having the masked area may then be plated with one or more of silver (Ag), copper (Cu), nickel (Ni), gold (Au), tin (Sn), or tin (Sn)-lead (Pb) to form the plated layer 80 over the exposed areas of the core 82. Selection of the material of the plated layer 80 may depend upon the specific electrical and thermal conductivity requirements of the lead frame. During plating, the plating material may not coat the organic coating but may coat the remainder of the core material 82. Removing the organic coating may leave a recess, as is depicted in FIGS. 7A and 7B. Thus, rather than removing a preexisting plated layer 80 to form the recess, the recess is formed by masking the core material 82, adding plating material around the mask, and then removing the mask.

A recess formed in any of the above-described manners may leave the core material 82 exposed. Where the core material 82 is a metal, once that metal is exposed to the ambient environment under the necessary conditions, the metal may oxidize. In this regard, oxidation of the core material 82 may occur in a separate dedicated process by which the lead frame 46, 48 is exposed to an atmosphere to intentionally oxidize the metal of the core material 82. In one exemplary oxidation process, the lead frame 46, 48 may be placed into an oven with air and heated for a predetermined amount of time to oxidize the core material 82. Alternatively, or in combination with a separate process, the exposed core material 82 may spontaneously oxidize during a solder reflow step in which the chips 10 are soldered together with the lead frames 46, 48. Many metals are known to form a tough oxide layer that is not easily removed including, but not limited to, iron (Fe), iron alloys, nickel (Ni), and nickel alloys, to name a few. It is known that copper (Cu) and silver (Ag) may also form oxide surface layers that are more easily removed than an iron oxide layer. Nevertheless, these oxides may also be used to form one or more of the solder dams 58, 60, 62, 64 according to embodiments of the invention. Oxidation of the exposed metal may result in a layer of metal oxide that may be only a few angstroms (less than about 10 Å) thick, though thicker metal oxide layers are possible and may depend on the constituent metal elements in the recess.

In any event, the oxidized metal may form an area of reduced wettability to the liquid solder of the solder dam 58, 60, 62, 64. That is, in one embodiment, during mounting the stacked capacitor assembly 44 to the circuit board 32, the liquid solder used to form fillets 40, 42 may not reach the joints 24, 26 because the flow rate of the liquid solder is reduced sufficiently by at least the presence of the metal oxide in the recess so that there is insufficient time for the solder to flow across the solder dam 58, 60, 62, 64 to reach the joints 24, 26 during the mounting process.

According to any one of these processes, and with reference to FIGS. 7B and 7C, multiple recesses may be formed adjacent one another. By way of example only, as shown in FIG. 7B, two recesses may be formed into the surface of the lead frames 46, 48. It will be appreciated that embodiments of the present invention are not limited to having a single recess or two recesses, as multiple recesses may be formed along the surfaces of one or both of the lead frames 46, 48.

In this regard, as shown in FIG. 7C, the recess may include a contoured surface. This may include an intentionally roughened surface having a roughness that exceeds the roughness of the surface of the lead frame 48. By way of example, the surface roughness in the recess may exceed that by at least 10%. The intentionally roughened surface may include multiple, overlapping recesses that collectively form a single macro recess as depicted in FIG. 7C. Not being bound to any theory, it is contemplated that the higher surface area within the recess due to the greater roughness and/or the multiple peaks and valleys within the surface roughness may reduce the flow of liquid solder across the recess.

Figure 8:
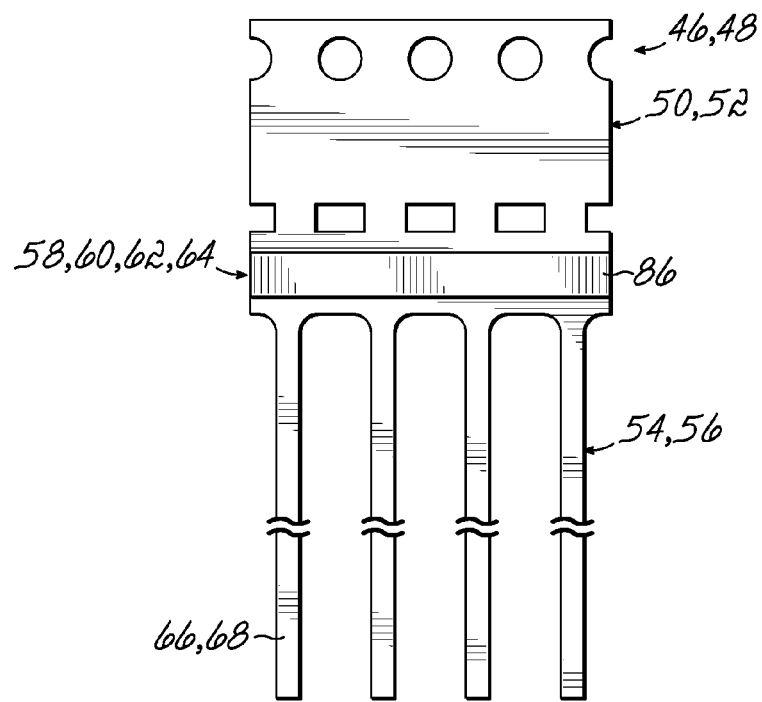
FIG. 8 is a side elevation view of a lead frame according to one embodiment of the invention.
Figure 9:
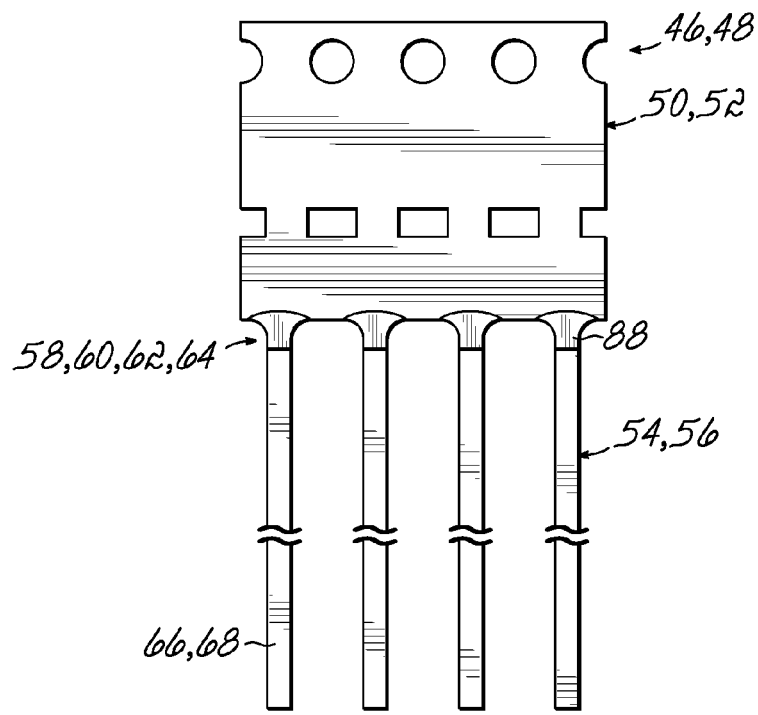
FIG. 9 is a side elevation view of a lead frame according to one embodiment of the invention.

Any of the above-described solder dams 58, 60, 62, 64 (e.g., the recess, the ridge, or the surface having a reduced wettability) may be in the form of a stripe 86, as is shown in FIG. 8. The stripe may be a uniform, linear stripe formed along the surface of the lead frame 46, 48 having any one of the cross-sectional configurations shown in FIG. 6, 6A or 7A-7C. As shown in FIG. 8, the solder dam 58, 60, 62, 64 extends substantially the full width of the lead frame 46, 48, that is, from one edge to the opposing edge of the main portion 50, 52. While not shown, anyone single one of the solder dams 58, 60, 62, 64 may extend around each opposing edge of the lead frame 46, 48. Embodiments of the present invention are not limited to a linear stripe 86 shown in FIG. 8. By way of example, other configurations may include a nonlinear stripe 88, as shown in FIG. 9. The nonlinear stripe 88 may be discontinuous but may extend across each of the separate leads of the lead portion 54, 56 and be in the form of an arc or have a circular configuration.

Figure 10:
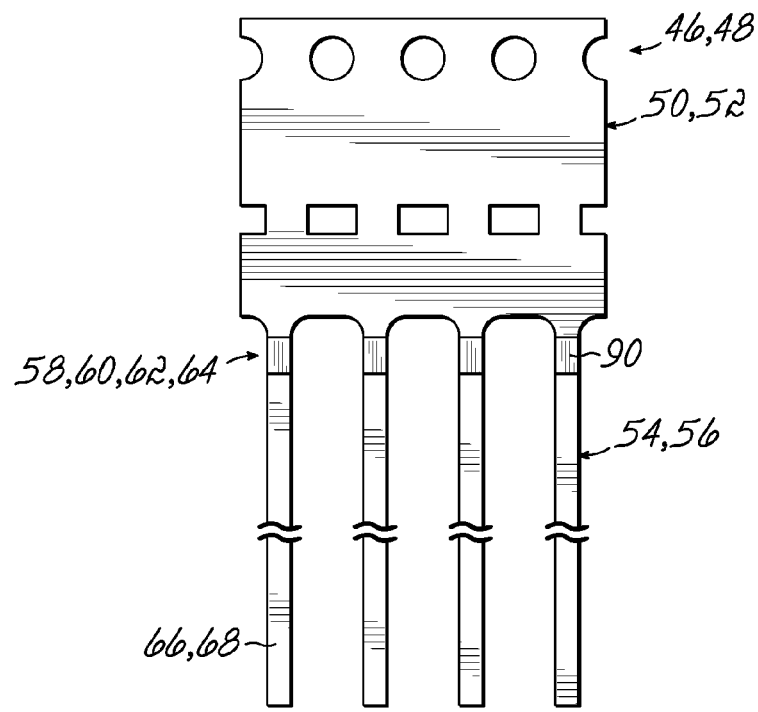
FIG. 10 is a side elevation view of a lead frame according to one embodiment of the invention.
Figure 11:
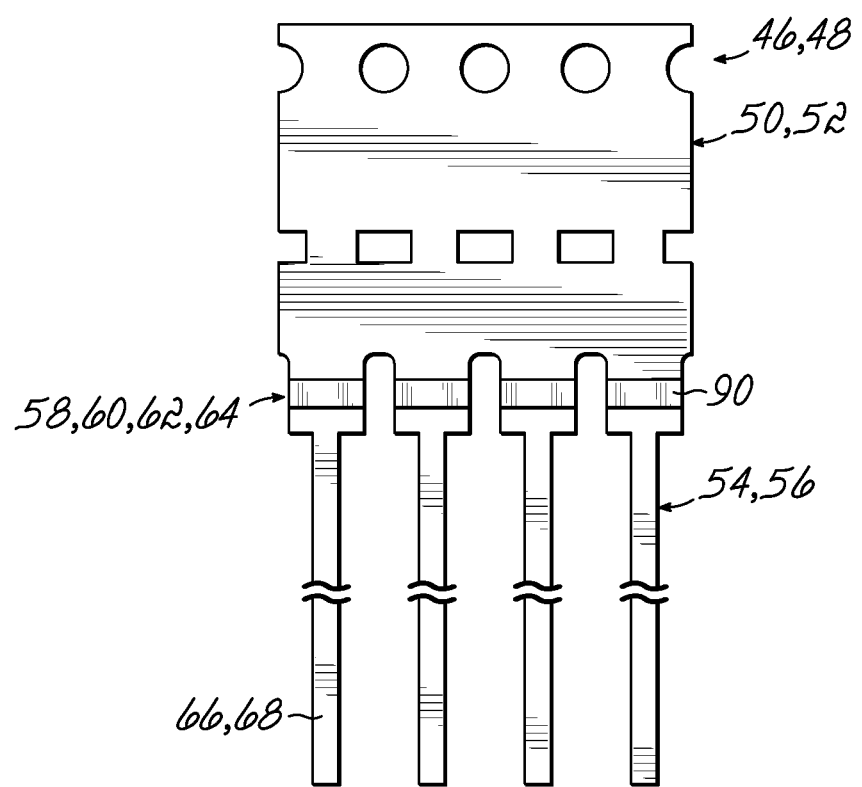
FIG. 11 is a side elevation view of a lead frame according to one embodiment of the invention.

Other stripe configurations are shown in FIGS. 10 and 11, in which the stripe 90 extends across each of the leads of the lead portion 54, 56, but is more linearly formed.

While the present invention has been illustrated by a description of various embodiments and while these embodiments have been described in some detail, it is not the intention of the inventors to restrict or in any way limit the scope of the appended claims to such detail. Additional advantages and modifications will readily appear to those skilled in the art. The various features of the invention may be used alone or in any combination depending on the needs and preferences of the user.

What is claimed is:

1. A method of manufacturing an electrical device to be electrically coupled to a circuit board with a first solder of a tin based alloy, the method comprising:
   modifying a surface portion on a first lead frame having a first foot to form a first solder dam, the first solder being on the first foot; and
   soldering a first lead frame to a capacitor with a second solder to form a first solder joint, the second solder having a higher melting temperature than a melting temperature of the first solder and being of a lead based alloy,
   wherein during soldering, the first solder dam prevents the first solder from flowing into contact with the second solder so as to prevent a eutectic alloy from being formed between the tin based alloy of the first solder and lead based alloy of the second solder.

2. The method of manufacturing of claim 1, wherein the first lead frame includes an outer plating layer of the first solder configured to facilitate soldering of the electrical device to the circuit board with the first solder, and wherein modifying the surface portion to form the first solder dam includes removing the outer plating layer to form a recess.

3. The method of manufacturing of claim 2, wherein removing includes exposing a different underlying metal on the first lead frame in the recess.

4. The method of manufacturing of claim 1, wherein modifying the surface portion to form the first solder dam includes oxidizing a metal in the first lead frame.

5. The method of manufacturing of claim 1, wherein modifying the surface portion includes applying a physical barrier to the first lead frame.

6. The method of manufacturing of claim 5, wherein the physical barrier is a non-solderable coating.

7. The method of manufacturing of claim 1, further comprising:
   modifying a surface portion on the second lead frame and soldering a second lead frame to the capacitor with the second solder.

8. The method of manufacturing of claim 1, wherein the first lead frame includes a main portion and the first foot extends from the main portion and is configured to couple the capacitor to the circuit board, each of the main portion and the first foot having a width, and wherein modifying the surface portion includes modifying substantially the full width of the main portion.

9. The method of manufacturing of claim 1, wherein the first lead frame includes a main portion and the first foot extends from the main portion and is configured to couple the capacitor to the circuit board, each of the main portion and the first foot having a width, and wherein modifying the surface portion includes modifying substantially the full width of the first foot.

10. The method of manufacturing of claim 1, wherein modifying the surface portion on the first lead frame includes modifying an interior surface portion of the first lead frame and an exterior surface portion of the first lead frame.

11. The method of manufacturing of claim 1, wherein modifying the surface portion includes sand blasting at least a portion of the first lead frame.

12. The method of manufacturing of claim 1, wherein modifying the surface portion includes chemically leaching at least a portion of the first lead frame.

13. The method of manufacturing of claim 1, wherein modifying the surface portion includes laser ablating at least a portion of the first lead frame.

14. The method of manufacturing of claim 1, wherein the first solder and the second solder form a tin (Sn) and lead (Pb) eutectic alloy at approximately 61.9 wt. % Pb and 38.1 wt. % Sn.

15. The method of manufacturing of claim 1, wherein the lead based alloy is a tin (Sn)-lead (Pb)-silver (Ag) alloy.

16. The method of manufacturing of claim 15, wherein the lead based alloy is a 10Sn/88Pb/2Ag alloy.

17. The method of manufacturing of claim 15, wherein the tin based alloy is a tin (Sn)-silver (Ag) alloy or a tin (Sn)-lead (Pb) alloy.

18. The method of manufacturing of claim 17, wherein the tin based alloy is one of a 96Sn/4Ag alloy or a 63Sn/37Pb alloy.

19. The method of manufacturing of claim 1, wherein the first lead frame includes a lead portion and a main portion, the lead portion being formable into the first foot, and modifying the surface portion includes modifying an interior surface of the lead portion to form the first solder dam and modifying an exterior surface of the main portion to form a second solder dam.

20. The method of manufacturing of claim 19, wherein the first lead frame includes a retainer that is integrally formed with the lead portion, the retainer being removable prior to soldering the electrical device to the circuit board and wherein modifying the lead frame occurs prior to removing the retainer.

21. The method of manufacturing of claim 1, wherein during soldering of the first lead frame to the capacitor with the second solder, the first solder is positioned above the second solder so that gravity acts on a molten first solder to flow the molten solder towards the second solder.

* * * * *